United States Patent
Saggio et al.

(10) Patent No.: US 12,342,582 B2
(45) Date of Patent: *Jun. 24, 2025

(54) 4H-SiC ELECTRONIC DEVICE WITH IMPROVED SHORT-CIRCUIT PERFORMANCES, AND MANUFACTURING METHOD THEREOF

(71) Applicant: STMicroelectronics S.r.l., Agrate Brianza (IT)

(72) Inventors: Mario Giuseppe Saggio, Aci Bonaccorsi (IT); Angelo Magri', Belpasso (IT); Edoardo Zanetti, Valverde (IT); Alfio Guarnera, Trecastagni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 18/464,141

(22) Filed: Sep. 8, 2023

(65) Prior Publication Data
US 2024/0222424 A1 Jul. 4, 2024

Related U.S. Application Data

(63) Continuation of application No. 17/346,771, filed on Jun. 14, 2021, now Pat. No. 11,798,981.

(30) Foreign Application Priority Data

Jun. 23, 2020 (IT) .................... 102020000015076

(51) Int. Cl.
 *H01L 29/06* (2006.01)
 *H10D 62/10* (2025.01)
 *H10D 62/832* (2025.01)

(52) U.S. Cl.
 CPC ....... *H10D 62/102* (2025.01); *H10D 62/8325* (2025.01)

(58) Field of Classification Search
 CPC ............. H01L 29/0607; H01L 29/1608; H01L 29/0696; H01L 29/1041; H01L 29/36;
 (Continued)

(56) References Cited

U.S. PATENT DOCUMENTS

| | | |
|---|---|---|
| 4,374,455 A | 2/1983 | Goodman |
| 4,672,407 A | 6/1987 | Nakagawa et al. |

(Continued)

FOREIGN PATENT DOCUMENTS

| | | |
|---|---|---|
| CN | 108695380 A | 10/2018 |
| DE | 102 50 175 A1 | 5/2004 |

(Continued)

OTHER PUBLICATIONS

Breglio et al., "Electro-Thermal instability in low voltage Power MOS:Experimental characterization," 11th International Symposium on Power Semiconductor Devices and ICs, May 26-28, 1999, Toronto, ON, Canada, pp. 233-236.

(Continued)

*Primary Examiner* — Cuong B Nguyen
(74) *Attorney, Agent, or Firm* — Seed IP Law Group LLP

(57) ABSTRACT

An electronic device includes a semiconductor body of silicon carbide, and a body region at a first surface of the semiconductor body. A source region is disposed in the body region. A drain region is disposed at a second surface of the semiconductor body. A doped region extends seamlessly at the entire first surface of the semiconductor body and includes one or more first sub-regions having a first doping concentration and one or more second sub-regions having a second doping concentration lower than the first doping concentration. Thus, the device has zones alternated to each (Continued)

other having different conduction threshold voltage and different saturation current.

9 Claims, 3 Drawing Sheets

(58) Field of Classification Search
CPC .......... H01L 29/66068; H01L 29/7831; H01L 29/7828; H01L 29/66712–66734; H01L 29/7802–7815; H01L 29/1095; H01L 29/7375; H01L 29/7393–7395; H01L 29/7397; H01L 29/66325; H01L 29/66333–66348; H10D 62/102; H10D 62/8325; H10D 12/031; H10D 62/393; H10D 30/611; H10D 62/60; H10D 30/635

See application file for complete search history.

(56) References Cited

U.S. PATENT DOCUMENTS

| | | | |
|---|---|---|---|
| 4,931,408 A | 6/1990 | Hshieh | |
| 5,528,058 A | 6/1996 | Pike, Jr. et al. | |
| 5,753,942 A | 5/1998 | Seok | |
| 5,817,546 A | 10/1998 | Ferla et al. | |
| 5,998,834 A | 12/1999 | Williams et al. | |
| 6,114,726 A | 9/2000 | Barkhordarian | |
| 6,228,719 B1 | 5/2001 | Frisina et al. | |
| 6,573,534 B1 | 6/2003 | Kumar et al. | |
| 7,312,501 B2 | 12/2007 | Ishizaka et al. | |
| 7,598,567 B2 | 10/2009 | Hefner et al. | |
| 9,190,492 B2 | 11/2015 | Consentino et al. | |
| 10,818,495 B2 | 10/2020 | Chan et al. | |
| 10,910,478 B1 | 2/2021 | Xu | |
| 10,950,695 B1 | 3/2021 | Potera et al. | |
| 11,798,981 B2 * | 10/2023 | Saggio | H01L 29/1041 |
| 2001/0012654 A1 | 8/2001 | Magri' et al. | |
| 2003/0006453 A1 | 1/2003 | Liang et al. | |
| 2004/0021173 A1 | 2/2004 | Sapp | |
| 2005/0035398 A1 | 2/2005 | Williams et al. | |
| 2007/0161217 A1 | 7/2007 | Salinas et al. | |
| 2007/0262390 A1 | 11/2007 | Ishida et al. | |
| 2010/0295060 A1 | 11/2010 | Kudou et al. | |
| 2011/0127607 A1 | 6/2011 | Cai | |
| 2012/0007139 A1 | 1/2012 | Tanaka | |
| 2012/0049902 A1 | 3/2012 | Corona et al. | |
| 2012/0068263 A1 * | 3/2012 | Hefner | H01L 29/7803 257/E29.256 |
| 2012/0126880 A1 | 5/2012 | Patti | |
| 2012/0205739 A1 | 8/2012 | Yamashita | |
| 2013/0248981 A1 | 9/2013 | Okumura et al. | |
| 2013/0334597 A1 | 12/2013 | Yamashita et al. | |
| 2014/0183553 A1 | 7/2014 | Zhang et al. | |
| 2014/0332901 A1 | 11/2014 | Yang et al. | |
| 2015/0043114 A1 | 2/2015 | Sarkar et al. | |
| 2015/0380494 A1 | 12/2015 | Furuhashi et al. | |
| 2017/0047415 A1 | 2/2017 | Saitoh et al. | |
| 2017/0077221 A1 | 3/2017 | Yilmaz et al. | |
| 2017/0098609 A1 | 4/2017 | Harrington, III | |
| 2017/0141206 A1 | 5/2017 | Koga | |
| 2017/0162679 A1 | 6/2017 | Schmidt | |
| 2017/0271442 A1 | 9/2017 | Uehara | |
| 2017/0288026 A1 | 10/2017 | Hikasa | |
| 2017/0301784 A1 | 10/2017 | Rieger | |
| 2017/0323970 A1 | 11/2017 | Dolny et al. | |
| 2018/0083129 A1 | 3/2018 | Kitagawa | |
| 2018/0308936 A1 | 10/2018 | Shimizu et al. | |
| 2020/0381551 A1 | 12/2020 | Nagakura et al. | |
| 2021/0013310 A1 | 1/2021 | Leendertz et al. | |
| 2022/0384578 A1 | 12/2022 | Rahimo et al. | |
| 2023/0420557 A1 | 12/2023 | Magri' et al. | |

FOREIGN PATENT DOCUMENTS

| | | |
|---|---|---|
| JP | 2001094098 A | 4/2001 |
| JP | 2005005578 A | 1/2005 |
| WO | WO 2006059300 A2 | 6/2006 |
| WO | WO 2019123601 A1 | 6/2019 |

OTHER PUBLICATIONS

Consoli et al., "Current Focusing Phenomena in Power MOSFETs," Symposium on Power Electronics, Electrical Drives, Automation & Motion, Jun. 13-16, 2000, Ischia, Italy, 6 pages.

Consoli et al., "Thermal Instability of Low Voltage Power-MOSFETs," 30th Annual IEEE Power Electronics Specialists Conference, Jul. 1, 1999, Charleston, SC, pp. 345-350.

Fusillo et al., "Low Voltage MOSFET's Behavior in FBSOA," *Power Electronics Europe, Issue 4*, 2016, 4 pages.

Hamada et al. "Low On-Resistance SiC-MOSFET with a 3.3-kV Blocking Voltage" Mitsubishi Electric Technical Report Mar. 2015 pp. 14-17.

Pintilie et al. "Analysis of electron traps at the 4H-SICSIO2 interface; influence by nitrogen implantation prior to wet oxidation" *Journal of Applied Physics* 108 024503 2010 9 pages.

Soler et al. "High Voltage 4H-SiC Power MOSFETs with Boron doped gate oxide" *IEEE Transactions on Industrial Electronics* 64(11) Nov. 2017 9 pages.

* cited by examiner

4H-SiC ELECTRONIC DEVICE WITH IMPROVED SHORT-CIRCUIT PERFORMANCES, AND MANUFACTURING METHOD THEREOF

BACKGROUND

Technical Field

The present disclosure relates to an electronic device and a manufacturing method thereof. In particular, the present disclosure refers to an electronic device provided with selective regions having different conduction threshold voltage or, alternatively, different saturation current.

Description of the Related Art

FIG. 1 shows a basic structure of a vertical MOSFET device 1, in lateral view and in a tri-axial reference system of orthogonal axis X, Y, Z. In a typical embodiment, the MOSFET device 1 includes a plurality of these basic structures that work together, sharing a same drain terminal (D), with all gate terminals (G) connected together by a deposited polysilicon mesh (not shown), and all of the source terminals (S) electrically connected and linked by a top metal layer 10.

As depicted in FIG. 1, the MOSFET device 1 comprises a semiconductor body 2, of semiconductor material (which includes a substrate and, optionally, one or more epitaxial layers), having a top surface 2a and a bottom surface 2b. The semiconductor body 2 is, e.g., N– doped. At the bottom surface 2b, a drain region 4 is formed, e.g., by implanting dopant species of N-type (N+ doped). At the top surface 2a body regions 5 (P doped) surround source regions 8 (N+ doped). Gate structures 6, including a stack formed by a gate conductive layer 6a and a gate dielectric layer 6b, extend on the top surface 2a, overlapping in part the source regions 8. A respective insulating layer 9 covers the gate structures 6.

The top metal layer 10 electrically contacts the source regions 8 and the body regions 5 at superficial portions 16 and 17 respectively, in order to bias, during use, the source regions 8 and the body regions 5 at a same biasing voltage.

To improve the electrical contact between the top metal layer 10 and the body regions 5, a P-well region (P+ doped) 14 is formed in some of the body regions 5 and facing the top surface 2a in a region corresponding to the superficial portion 17. Typically, a silicide interfacing layer (not shown) is formed at the superficial portion 17, to form an ohmic contact between the metal 10 and the implanted P-well region 14. The P-well region 14 is formed only where the metal layer 10 is designed to contact the body regions 5. The P-well region 14 is arranged between source regions 8, in a respective body region 5.

Where, by design, it has been decided to form the contact between the top metal layer 10 and the source regions 8 (i.e., at the superficial region 16), the respective source region 8 extends continuously within the body region 5 which houses it, facing the top surface 2a at the superficial region 16. Further layers, to enhance the electrical contact between the metal 10 and the source 8 may be formed, in a per se known way and not shown.

During the ON state of the MOSFET device 1, while gate-source voltage Vas is above threshold, a conduction current is localized in the drain region 4 and in the region of the semiconductor body 2 below the gate structure 6 (current flow 18). During OFF state of the MOSFET device 1, the voltage drop across the drain D and source S is sustained by a PN junction at reverse bias, and a very small current (leakage) flows through the PN junction. If the voltage increases too much and the electrical field reaches a critical value, the PN junction goes into breakdown, and the current starts to flow through the body region 5. If an overvoltage is applied to the PN junction, a current flows through it while the MOSFET device 1 limits the actual drain-source breakdown voltage ($BV_{DS}$). The breakdown mechanism itself is not destructive for a PN junction. However, overheating caused by the high breakdown current and voltage damages the PN junction unless sufficient heat sinking is provided.

Considering the MOSFET structure in greater detail, one may see that the PN junction is not a "perfect diode". The diode is the collector-base junction of a Bipolar Junction Transistor (BJT), also called the parasitic transistor, made by the N+ source 8, P/P+ body 5, and N+ drain 4, with the base shorted to the emitter by the metal layer 10.

When designing the device, the behavior of the same in failure mode at the short circuit event should be taken into account, where the simultaneous presence of high current and high voltage produces a thermal runaway, leading to the destruction of the device (e.g., typical case of event that occurs when an electric motor halts).

As is known, some semiconductor materials are ideal for producing electronic components, such as diodes or transistors, in particular for power applications. These materials have wide forbidden band gap, in particular, have an energy value Eg of the forbidden band gap greater than 1.1 eV, low on-state resistance ($R_{ON}$), high value of thermal conductivity, high operating frequency, and high velocity saturation of charge carriers. A material having said characteristics, and designed to be used for manufacturing electronic components, is silicon carbide (SiC). In particular, silicon carbide, in its different polytypes (e.g., 3C—SiC, 4H—SiC, 6H—SiC), is preferable to silicon as regards the properties listed previously.

Electronic devices provided on a silicon-carbide substrate, as compared to similar devices provided on a silicon substrate, present numerous advantageous characteristics, such as low output resistance in conduction, low leakage current, high working temperature, and high working frequencies.

However, the above issues are not fully overcome by the use of SiC and, to improve the avalanche capability of the MOSFET device, common solutions foresee an edge structure having a much higher breakdown threshold with respect to the active area. However, due to limitation of efficiency at the edges of the device, this target is not always feasible.

The resistance in ON-state is furthermore impacted, since the source resistance depends upon the doping value of the source region 8.

BRIEF SUMMARY

In various embodiments, the present disclosure provides an electronic device and a manufacturing method thereof, that overcome the drawbacks of the prior art. In one or more embodiments of the present disclosure provide the technical advantage of limiting the thermal runaway, and a method that limits the saturation current and the power dissipated locally, with minimum impact on the output resistance of the device.

According to the present disclosure, an electronic device and a manufacturing method thereof are provided.

In at least one embodiment, an electronic device is provided that includes a semiconductor body of silicon carbide (SiC) having a first and a second surface, opposite to one another along a direction. A body region, having a first conductivity, extends in the semiconductor body at the first surface. A source region, having a second conductivity opposite to the first conductivity, extends in the body region at the first surface of the semiconductor body. A doped region, having the second conductivity, extends continuously at the entire first surface of the semiconductor body, and includes one or more first sub-regions having a first doping density and one or more second sub-regions having a second doping density lower than the first doping density.

In at least one embodiment, a method for manufacturing an electronic device is provided that includes: forming a body region, having a first conductivity, in a semiconductor body of silicon carbide (SiC) at a first surface, the semiconductor body having a second surface opposite to the first surface along a direction; forming a source region, having a second conductivity opposite to the first conductivity, in the body region at the first surface of the semiconductor body; forming a drain region, having the second conductivity, at the second surface; and forming a doped region, having the second conductivity, extending seamlessly at the entire first surface of the semiconductor body, the forming the doped region includes: forming one or more first sub-regions having a first doping density; and forming one or more second sub-regions having a second doping density lower than the first doping density.

In at least one embodiment, a device is provided that includes a semiconductor body having a first surface, and a second surface opposite the first surface along a direction. A body region, having a first conductivity, extends in the semiconductor body at the first surface. A source region, having a second conductivity opposite to the first conductivity, extends in the body region at the first surface of the semiconductor body. A drain region, having the second conductivity, extends at the second surface of the semiconductor body. A doped region, having the second conductivity, extends continuously at the entire first surface of the semiconductor body. The doped region includes a first sub-region having a first doping density and a second sub-region having a second doping density lower than the first doping density. A first gate structure is on the first doped region, and a second gate structure is on the second doped region.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
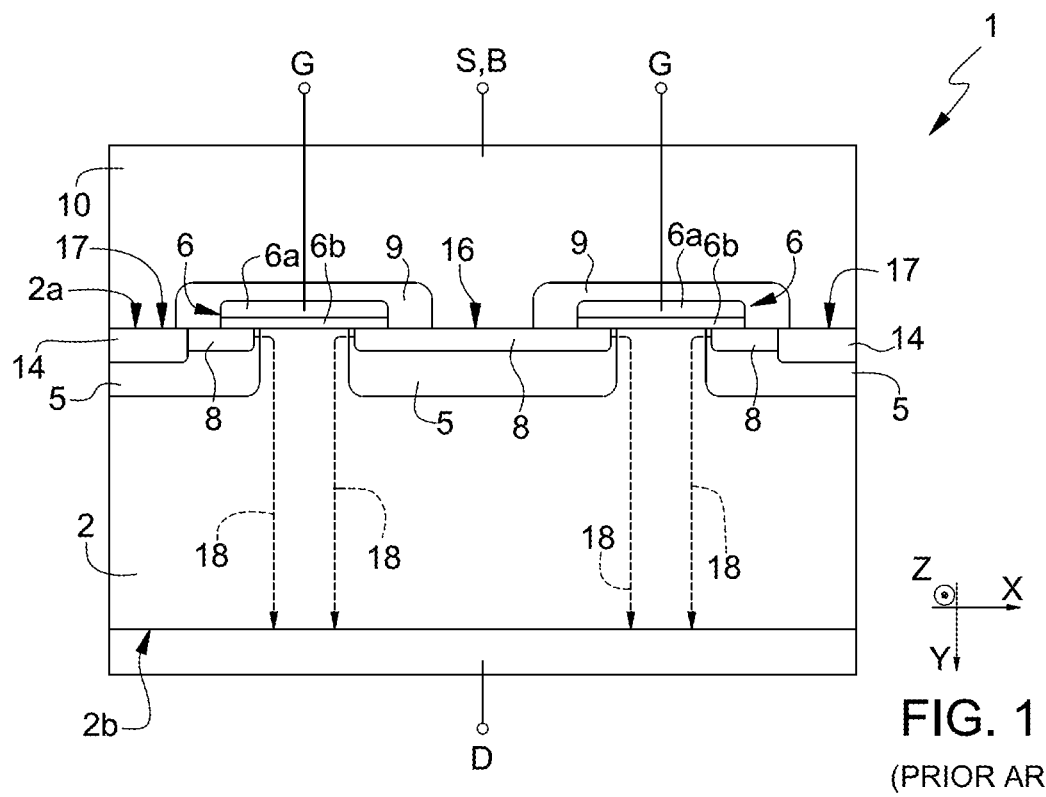
FIG. 1 shows a MOSFET device of a known type.
Figure 2:
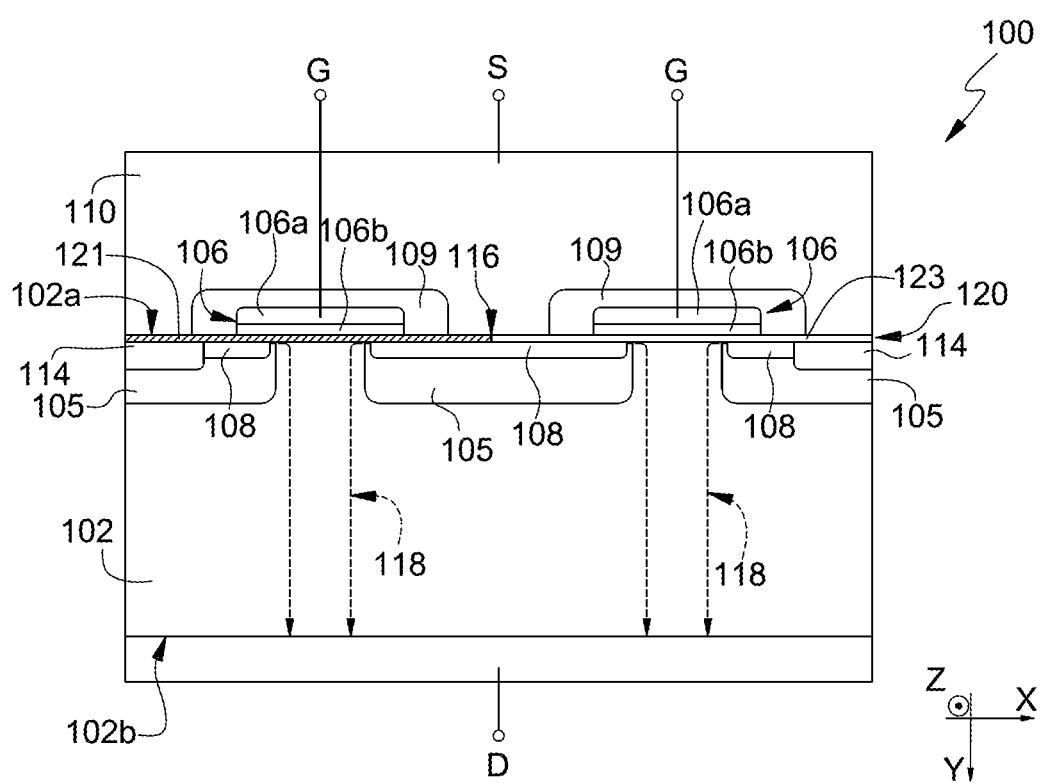
FIG. 2 shows a MOSFET device according to an embodiment of the present disclosure.

FIG. 2 shows a portion of MOSFET device 100 according to an embodiment of the present disclosure. FIG. 2 is a lateral cross-section view, in the same tri-axial reference system of orthogonal axis X, Y, Z of FIG. 1.

As already discussed with reference to FIG. 1, the portion shown in FIG. 2 may be a basic structure, or "cell", that may be used to develop a MOSFET device 100 by replicating the basic structure a desired number of times; such basic structures work together, sharing a common drain terminal (D), a common gate terminal (G), and a common source terminal (S).

It is apparent that, when replicating the portion of FIG. 2, variations in the basic structure may be introduced, as apparent to the skilled person in the art, for example in order to comply with one or more among design requirements, area occupation, electrical requirements, manufacturing requirements, etc.

The MOSFET device 100 comprises a semiconductor body 102, of semiconductor material (which includes, for example, a substrate and, optionally, one or more epitaxial layers), having a top surface 102a and a bottom surface 102b opposite to one another along axis Z.

In particular, the semiconductor body 102 is made of silicon carbide (SiC), more in particular 4H—SiC. The semiconductor body 102 is, in one embodiment, N− doped. Facing the bottom surface 102b is a drain region 104, e.g., formed by implanted dopant species of N-type (N+ doped). Body regions 105 (P doped) are arranged at the top surface 102a.

Source regions 108 (N+ doped) are formed by implantation in the semiconductor body 102, within the body regions 105, facing the top surface 102a. Therefore, the body regions 105 surround respective source regions 108 formed therein.

Gate structures 106 extend on the top surface 102a, and include a stack formed by a gate conductive layer 106a (e.g., of metal material) and a gate dielectric layer 106b (of insulating or dielectric material). A respective insulating layer 109 covers each gate structure 106, to electrically insulate the gate structures 106 from the metal layer 110. The gate structures 106 overlap in part the source regions 8; a respective channel region 118 is formed, during use, in the region of the semiconductor body 102 below the gate structures 106, between body regions 105/source regions 108, in a per se known way. The current path is pictured in FIG. 2 with a dashed line 118 and goes from the source regions 108 towards the drain region 104 (vertical conduction).

The active area of the MOSFET device 100 is the area where current conduction takes place and, in particular, where the channel is formed. Typically, the active area is surrounded, either completely or partially, by an edge termination region, not shown and per se known. The edge termination region is, e.g., an implanted region having a P conductivity type.

In a way which is not shown in detail and which is per se known, all gate structures 106 are electrically connected together (e.g., by a polysilicon mesh), and all of the source regions 108 are electrically connected together.

The top metal layer 110 is in electrical contact with the source regions 108 and the body regions 105 at respective contact zones, in order to bias, during use, the source regions 108 and the body regions 105 at a same biasing voltage.

To improve the electrical contact between the top metal layer 110 and the body regions 105, an electrical-contact interface (P+ doped) 114 is formed in one or more body regions 105, at the top surface 2a. Typically, each electrical-contact interface 114 includes a silicide interfacing layer (not shown), to form an ohmic contact between the top metal layer 110 and the respective electrical-contact interface 114. The electrical-contact interface 114 is formed where the metal layer 110 reaches the top surface 102a to contact the body regions 105.

According to an aspect of the present disclosure, an electrical-contact interface 116 is also present between the top metal layer 110 and the region of the semiconductor body where, by design, it has been decided to form the contact between the top metal layer 110 and the source regions 108.

According to an aspect of the present disclosure, the device 100 presents an implanted region 120 extending in proximity to, or directly facing, the top surface 102a, along the entire extension of the device 100. The implanted region 120 is of N-type and has the function of modulating the saturation current of the device 100. In this context, the saturation current is the maximum current that the device sustains at a given gate voltage Vg and remains almost constant exceeding a certain drain-source voltage $V_{DS}$ (knee voltage) once exceeded the linear region (where the on-state resistance $R_{ON}$ is identified). The saturation current value is limited by the switch-on voltage value of the device (Vth): a higher Vth corresponds to a lower saturation current.

The implanted region 120 is designed so as to present at least a first sub-region 121 having a first N-type dopant value, and at least a second sub-region 123 having a second N-type dopant value, lower than the first value of the first sub-region 121.

The implanted region 120 extends, facing the top surface 102a, within the body regions 105, the source regions 108, and in the zone below the gate dielectric 106b intended to house the conductive channel and in the drain regions 104.

Therefore, the implanted region 120 is in electrical contact with the body regions 105, the source regions 108 and the electrical-contact interfaces 114.

The depth of the implanted region 120 in the semiconductor body 102, measured from the top surface 102a along the Z direction, ranges from 10 nm to 0.1 μm, in particular from 20 nm to 50 nm.

Where the implant dose is increased (first sub-region 121), the threshold voltage Vth is lowered, i.e., the gate-source voltage value $V_{GS}$ necessary to generate, or switch on, the conductive channel with respect to the second sub-region 123, is reduced. The threshold voltage Vth is defined as the gate-source voltage $V_{GS}$ at which the drain-source current $I_{DS}$ is equal to 250 μA/mm².

By localizing the implant in proximity to the top surface 102a (in particular at the interface between the semiconductor body 102 and the gate dielectric layer 106b) it is possible to influence the threshold voltage Vth in that specific zone of the device 100, as a consequence of the saturation of interface defects typically present in SiC (e.g., as demonstrated by I. Pintilie et al., "Analysis of electron traps at the 4H—SiC/SiO$_2$ interface; influence by nitrogen implantation prior to wet oxidation", Journal of Applied Physics 108, 024503, 2010).

In this manner, during operation, the sub-region 121, having higher dopant density, switches on with a voltage $V_{GS}$ lower than the voltage $V_{GS}$ required for switching on the sub-region 123. As a result, as the voltage $V_{GS}$ increases, a conductive channel is formed first in the sub-region 121 and, subsequently, in the sub-region 123. Furthermore, when the voltage $V_{GS}$ is such to switch on both the channel in the sub-region 121 and in the sub-region 123, however, a higher current density is observed in the sub-region 121.

The N-type dopant concentration in the first sub-region 121 is such that it exceeds the surface concentration of the body region 105 by a factor ranging from 5 to 20 times the concentration of the body region 105; the N-type dopant concentration in the second sub-region 123 is such that it exceeds the surface concentration of the body region 105 by a factor ranging from 2 to 10 times the concentration of the body region 105.

The ratio Vth2/Vth1 between the threshold voltage Vth2 of the sub-region 123 and the threshold voltage Vth1 of the sub-region 121 ranges from 1.1 to 2.5 and is defined by the ratio of dopant concentration present in the two sub-regions.

Thus, with an appropriate layout of the implanted region 120, it is possible to define zones of the device 100 designed to carry a greater electric current with respect to other zones of the device 100 or, in other words, it is possible to design zones of the device 100 where the carried current is limited, limiting, as a result, the saturation current in these zones. Zones dedicated to the carriage of the highest electric current are chosen on the basis of design considerations, selecting them among the most robust device zones or distributing this current uniformly such that there is no excessive concentration in some zones with respect to others.

Figure 3A:
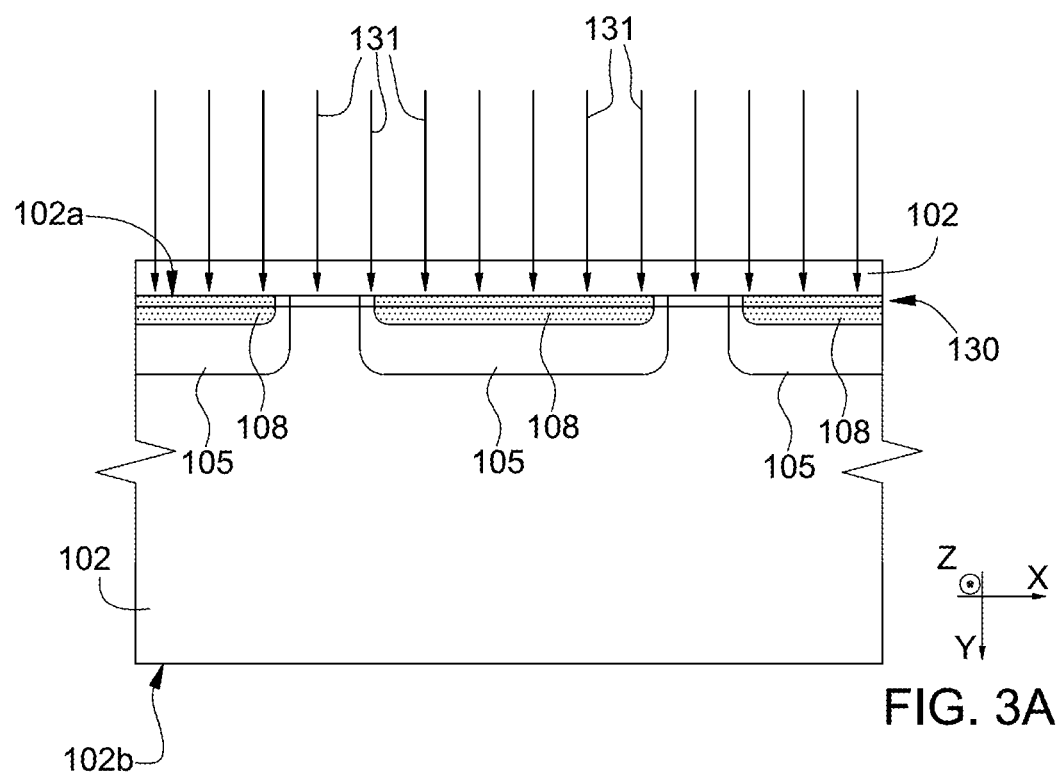
FIGS. 3A and 3B show process steps to manufacture the MOSFET device of FIG. 2.
Figure 3B:
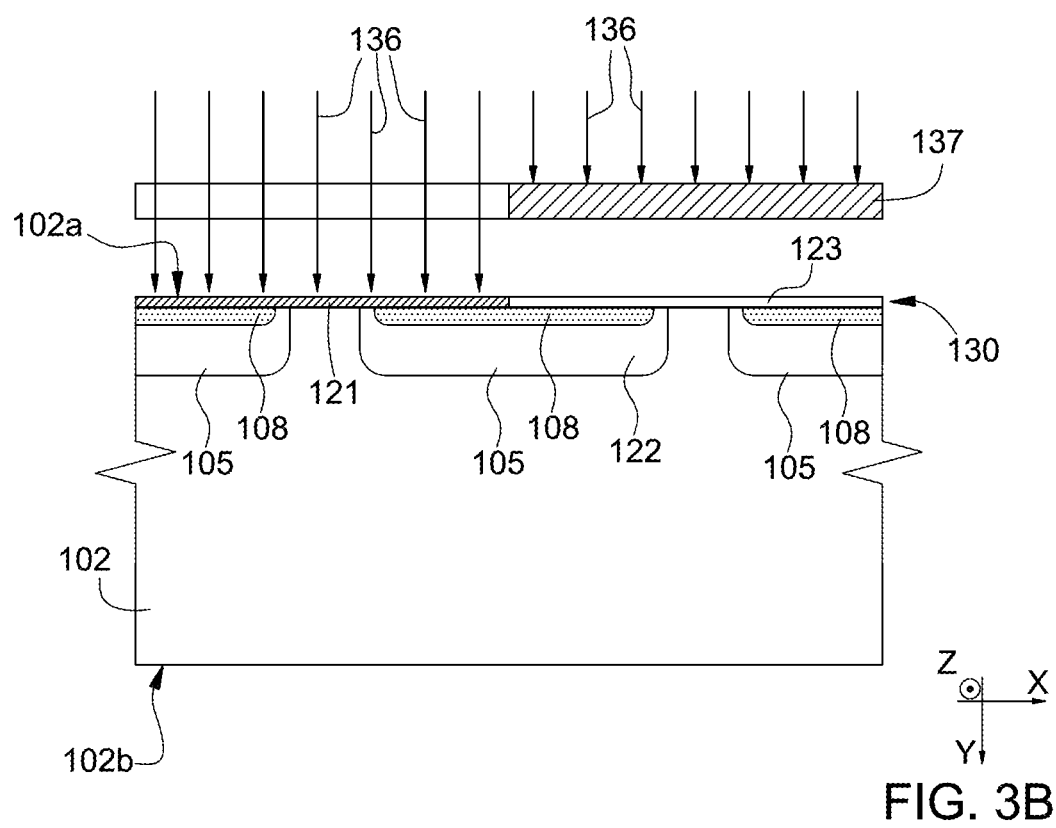

As to the manufacturing process of the implanted region 120, reference is made to FIGS. 3A and 3B, which show a portion of a semiconductor wafer limited to the features of the same that are useful to understand the present disclosure. FIGS. 3A and 3B illustrate exclusively manufacturing steps useful for the formation of the implanted region 120, while remaining process steps for starting and completing the manufacturing of the device 100 are not described or illustrated, as they are not part of the present disclosure.

With reference to FIG. 3A, after having formed the body regions 105 through an implant of P doping species, and the source regions 108 through an implant of N doping species, a first unmasked implant of N-type species (e.g., Nitrogen or Phosphorus) is carried out, in order to form a first implanted region 130 in the interface 102a. This first implant (shown by means of arrows in FIG. 3A) is carried out with implant energy in the range 10-100 keV. A protection layer 134 may be formed on the surface 102a in order to obviate any surface damage of the semiconductor body 102 deriving from the implant.

The implant at step of FIG. 3A forms, in particular, the second sub-region 123 described with reference to FIG. 2, and contributes to forming the first sub-region 121.

Then, FIG. 3B, a second masked implant of N-type species (for example, Nitrogen or Phosphorus) is carried out, in order to complete the formation of the first sub-region 121.

This second implant (shown by means of arrows 136 in FIG. 3B) is carried out with implant energy in the range 10-100 keV. A mask 137 used for the second implant leaves exposed superficial portions of the semiconductor body 102 corresponding to the regions where only the first sub-region 121 is to be formed. In one embodiment, the mask 137 may be formed as a hard mask, depositing a mask layer, for example of silicon oxide, on the surface 102a of the semiconductor body 102 and shaping this mask layer to expose the superficial regions of the semiconductor body 102 where it is desired to implant the sub-region 121.

Then, an annealing step is carried out, to favor the activation of all the implanted species of the sub-regions 121, 123. The annealing step is carried out at temperature in the range 1600-1800° C. This annealing step may be dedicated for the formation of the implanted region 120, or common to the implanted region 120 and to the body and/or source and/or drain regions.

Figure 4A:
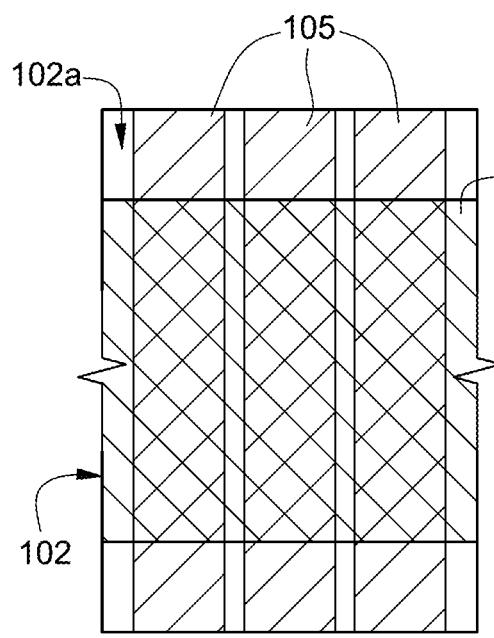
FIGS. 4A-4D show plan views of respective layouts of implanted regions of the MOSFET device of FIG. 2, according to respective embodiments of the present disclosure.

FIG. 4A illustrates, purely by way of example, a top view of a portion of the device 100 limited to the body regions 105 and to the implants of the first sub-region 121 (as said, the sub-region 123 is considered to be uniformly present at all the surface 102a of the device 100—not including portions of the surface 102a which do not belong to the device 100). As is noted, in this embodiment, a plurality of body regions 105 extend in the form of strips parallel to each other along the Y-axis direction; a plurality of first sub-regions 121 extend in the form of strips parallel to each other along the X-axis direction, overlapping the plurality of body regions 105. At designer's choice, the first sub-regions 121 may cover a variable percentage of the body regions 105, i.e., cover a percentage ranging from 50% to 80% of the body regions 105.

Figure 4B:
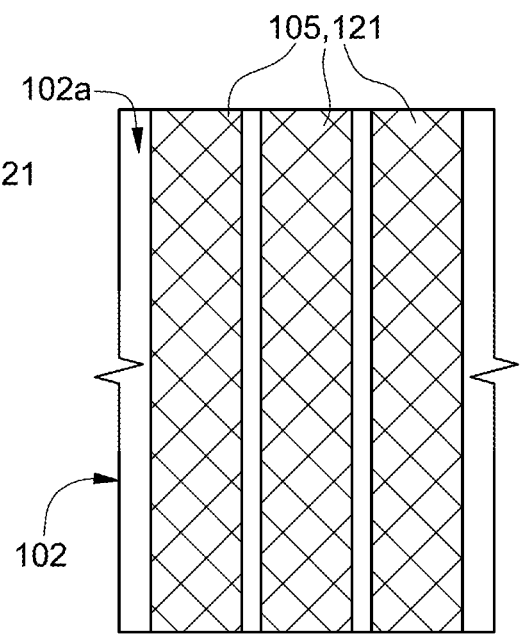
Figure 4C:
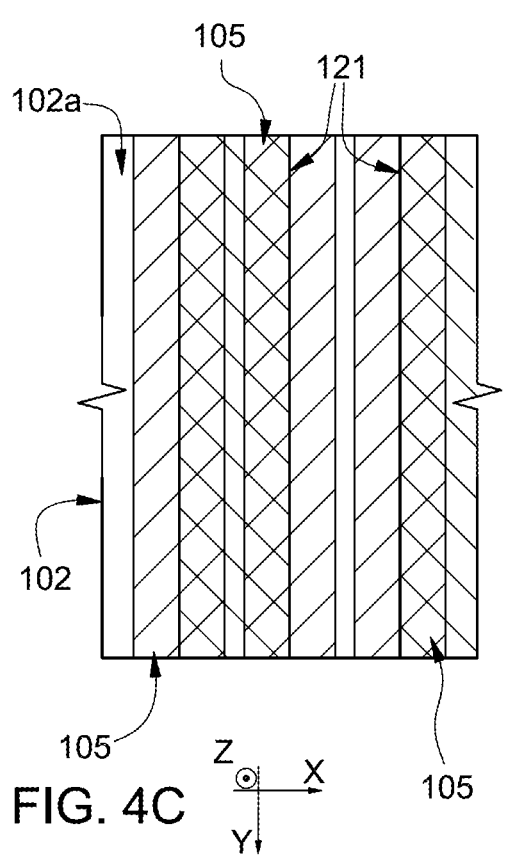
Figure 4D:
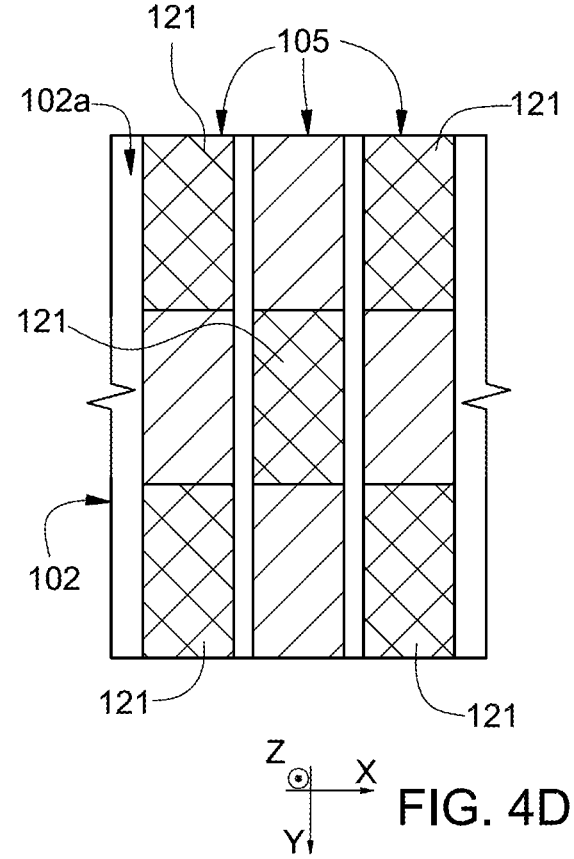

FIGS. 4B-4D illustrate, according to respective embodiments alternative to each other and to that of FIG. 4A, respective top views of a portion of the device 100 limited to the body regions 105 and to the implants of the first sub-region 121. As is noted, in these embodiments, a plurality of body regions 105 extend in the form of strips parallel to each other along the Y-axis direction, similarly to FIG. 4A; a plurality of first sub-regions 121 extend in the form of strips parallel to each other along the same Y-axis direction, partially overlapping the plurality of body regions 105.

The strips of the first sub-regions 121 may extend completely overlapping respective strips of the body regions 105 as illustrated in FIG. 4B, or only partially overlapping them, as illustrated in FIGS. 4C and 4D.

FIG. 4B (and similarly FIG. 4C) illustrates first sub-regions 121 which extend to cover body regions 105 alternated to each other (one every two, i.e., the total area of the first sub-regions 121 is equal to 50% of the total area of the body regions 105).

FIG. 4C illustrates first sub-regions 121 which extend between strips arranged side by side and directly facing each other of the body regions 105, partially overlapping these body regions 105 arranged side by side. As for FIG. 4B, the total extension (or area) of the first sub-regions 121 is equal to 50% of the total area of the body regions 105.

FIG. 4D illustrates an implementation of the first "checkerboard" sub-regions 121, where the first sub-regions 121 extend along the body regions 105 discontinuously.

From what has been described, the advantages that the disclosure achieves are apparent.

The embodiments of the present disclosure have been found to increase the ruggedness during short-circuit tests. In fact, the structure of FIG. 2 (in the various described embodiments) allows to modulate the saturation current of the MOSFET device 100 at selected portions of the device 100, with a minimum impact on the output resistance of the device 100.

The layout design is carried out so as to eliminate zones with high current density. For example, therefore at wires or clips, the saturation current is limited, to uniform the total current which circulates in the device and to avoid the destruction of the device in case of short circuit.

Finally, it is clear that modifications and variations may be made to what has been described and illustrated herein, without thereby departing from the scope of the present disclosure.

For example, the embodiments previously disclosed refer to a N-channel MOSFET. However, the present disclosure may be applied, as apparent to the skilled person, to a P-channel MOSFET as well.

In some embodiments, an electronic device (100) may be summarized as including a semiconductor body (102) of silicon carbide, SiC, having a first (102a) and a second surface (102b), opposite to one another along a direction (Z). A body region (105) has a first conductivity (P), and extends in the semiconductor body (102) at the first surface (102a). A source region (108) has a second conductivity (N), opposite to the first conductivity (P), and extends in the body region (105) at the first surface (102a) of the semiconductor body (102). A drain region (104) has the second conductivity (N), and extends at the second surface (102b) of the semiconductor body (102). A doped region (120), having the second conductivity (N), extends continuously at the entire first surface (102a) of the semiconductor body (102), and includes one or more first sub-regions (121) having a first doping density and one or more second sub-regions (123) having a second doping density lower than the first doping density.

In some embodiments, the first sub-regions (121) are alternated with the second sub-regions (123) so to form zones alternated to each other having different conduction threshold voltage (Vth1, Vth2) or, alternatively, different saturation current.

In some embodiments, each first sub-region (121) and each second sub-region (123) is designed in such a way that the ratio (Vth2/Vth1) between a conduction threshold voltage (Vth2) of each second sub-region (123) and a conduction threshold voltage (Vth1) of each first sub-region (121) ranges from 1.1 to 2.5.

In some embodiments, the first and the second sub-regions (121, 123) have a depth, in the semiconductor body from the surface (102a) ranging from 10 nm to 0.1 µm.

In some embodiments, the first doping density has a value ranging from 5 to 20 times a respective doping density value of the body region (105) and the second doping density has a respective value ranging from 2 to 10 times the doping density value of the body region (105).

In some embodiments, the first sub-regions (121) are contiguous to, and electrically connected to, respective second sub-regions (123).

In some embodiments, the second sub-regions (123) occupy a volume of the doped region (120) ranging from 50% to 80%.

In some embodiments, a gate structure (106) is disposed on the first surface (102a) of the semiconductor body. The gate structure includes: a gate dielectric layer (106b), a metal gate layer (106a) on the gate dielectric layer (106b), and an insulating layer surrounding the metal gate layer (106a). The doped region (120) may extend within the source regions, the body regions and below the gate structure (106).

In some embodiments, the semiconductor body (102) is of 4H—SiC.

In some embodiments, a method for manufacturing an electronic device (100) may be summarized as including the steps of: arranging a semiconductor body (102) of silicon carbide, SiC, having a first (102a) and a second surface (102b), opposite to one another along a direction (Z); forming a body region (105), having a first conductivity (P), in the semiconductor body (102) at the first surface (102a); forming a source region (108), having a second conductivity (N) opposite to the first conductivity (P), in the body region (105) at the first surface (102a) of the semiconductor body (102); and forming a drain region (104), having the second conductivity (N), at the second surface (102b), characterized in that it further comprises the step of forming a doped region (120), having the second conductivity (N), extending seamlessly at the entire first surface (102a) of the semiconductor body (102), including the sub-steps of: forming one or more first sub-regions (121) having a first doping density; and forming one or more second sub-regions (123) having a second doping density lower than the first doping density.

In some embodiments, the first sub-regions (121) are alternated with the second sub-regions (123) so to form zones alternated to each other having different conduction threshold voltage (Vth1, Vth2) or, alternatively, different saturation current.

In some embodiments, each first sub-region (121) and each second sub-region (123) is designed in such a way that the ratio (Vth2/Vth1) between a conduction threshold voltage (Vth2) of each second sub-region (123) and a conduction threshold voltage (Vth1) of each first sub-region (121) ranges from 1.1 to 2.5.

In some embodiments, the first and the second sub-regions (121, 123) have a depth, in said semiconductor body from the surface (102a) ranging from 10 nm to 0.1 µm.

In some embodiments, forming said doped region (120) includes the steps of: carrying out an unmasked implant at the entire first surface (102a), thus forming a uniformly doped region having the second doping density; arranging an implant mask (137) on the first surface (102a), said implant mask (137) exposing superficial regions of the semiconductor body (102) at which it is desired to form the first sub-regions (121); carrying out a masked implant, using said implant mask (137), to form selectively doped regions having the first doping concentration.

In some embodiments, the first doping density has a value ranging from 5 to 20 times a respective doping density value of the body region (105) and the second doping density has a respective value ranging from 2 to 10 times the doping density value of the body region (105).

In some embodiments, the first sub-regions (121) are contiguous to, and electrically connected to, respective second sub-regions (123).

In some embodiments, the second sub-regions (123) occupy a volume of the doped region (120) ranging from 50% to 80%.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing an electronic device, comprising:
   forming a doped region in a semiconductor body of silicon carbide (SiC), the semiconductor body having a first surface and a second surface, the doped region having a first conductivity, extending seamlessly at the entire first surface of the semiconductor body, the forming the doped region including:
      forming one or more first sub-regions having a first doping density; and
      forming one or more second sub-regions having a second doping density lower than the first doping density;
   forming a body region, having a second conductivity opposite to the first conductivity, in the semiconductor body at the first surface;
   forming a source region, having the first conductivity, in the body region at the first surface of the semiconductor body; and
   forming a drain region, having the first conductivity, at the second surface.

2. The method of claim 1, wherein forming the doped region further includes contacting the doped region with the body region.

3. The method of claim 1, comprising:
   forming a first gate structure on a respective first sub-region of the one or more first-sub regions;
   forming an insulating portion covering the first gate structure;
   forming the insulating portion overlapping the gate structure and overlapping the respective first sub-region of the one or more first-sub regions;
   forming a first channel region within the semiconductor body, the first gate structure and the insulating portion overlapping the first channel region.

4. The method according to claim 3, wherein forming the first gate structure includes:
   forming a gate dielectric on the respective first sub-region of the one or more first sub-regions; and
   forming a metal gate layer on the gate dielectric.

5. The method according to claim 3, comprising forming a metal region over the insulating portion and over the semiconductor body.

6. The method according to claim 5, wherein forming the metal region including forming the metal region to be electrically coupled with the source region and the body region at a contact zone.

7. The method according to claim 5, comprising forming a second gate structure on a respective second sub-region of the one or more second-sub regions.

8. The method according to claim 7, comprising forming a second channel region within the semiconductor body, the second gate structure overlapping the second channel region.

9. The method of claim 8, wherein the first gate structure is spaced from the second gate structure at the first surface along a first direction, the first channel spaced from the second channel along the first direction.

* * * * *